United States Patent
Zhou et al.

(10) Patent No.: US 11,165,030 B2
(45) Date of Patent: Nov. 2, 2021

(54) DISPLAY PANEL AND DISPLAY DEVICE (71) Applicant: WUHAN CHINA STAR OPTOELECTRONICS SEMICONDUCTOR DISPLAY TECHNOLOGY CO., LTD., Hubei (CN)

(72) Inventors: Yang Zhou, Hubei (CN); Mugyeom Kim, Hubei (CN); Min Zheng, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 218 days.

(21) Appl. No.: 16/613,439

(22) PCT Filed: Oct. 10, 2019

(86) PCT No.: PCT/CN2019/110347
§ 371 (c)(1),
(2) Date: Nov. 14, 2019

(87) PCT Pub. No.: WO2020/237963
PCT Pub. Date: Dec. 3, 2020

(65) Prior Publication Data
US 2020/0381636 A1 Dec. 3, 2020

(30) Foreign Application Priority Data

May 31, 2019 (CN) .......................... 201910472062.5

(51) Int. Cl.
*H01L 51/00* (2006.01)
*H01L 27/32* (2006.01)
*G09F 9/30* (2006.01)

(52) U.S. Cl.
CPC ............ *H01L 51/0097* (2013.01); *G09F 9/30* (2013.01); *H01L 27/3276* (2013.01); *H01L 27/3288* (2013.01); *H01L 2251/5338* (2013.01)

(58) Field of Classification Search
CPC ............ H01L 51/0097; H01L 27/3276; H01L 27/3297; H01L 2251/5338; G09F 9/30
See application file for complete search history.

(56) References Cited

U.S. PATENT DOCUMENTS

2016/0155967 A1 6/2016 Lee et al.
2017/0147117 A1 5/2017 Song et al.
(Continued)

FOREIGN PATENT DOCUMENTS

CN 107003789 A 8/2017
CN 108257971 A 7/2018
(Continued)

*Primary Examiner* — Thanhha S Pham
(74) *Attorney, Agent, or Firm* — Mark M. Friedman (57) ABSTRACT

A display panel and a display device are provided, which including a folding area configured to bend the display panel. The display panel further comprising a film layer. The film layer is disposed in the folding area, and the film layer includes a metal layer. A stress balance line is provided in the film layer. When the folding area is bent, the stress balance line is a curve having an upper boundary and a lower boundary. A resultant force of tensile stress and compressive stress at any point on the stress balance line is zero. The metal layer is disposed between the upper boundary and the lower boundary of the stress balance line.

20 Claims, 8 Drawing Sheets

(56) References Cited

U.S. PATENT DOCUMENTS

2017/0309843 A1     10/2017  Kim
2019/0237490 A1      8/2019  Hu et al.
2021/0233938 A1*     7/2021  Wang ........................ G09F 9/30

FOREIGN PATENT DOCUMENTS

| CN | 108305880 A | 7/2018 |
| CN | 108470853 A | 8/2018 |
| CN | 108878482 A | 11/2018 |
| CN | 109599403 A | 4/2019 |
| CN | 109712536 A | 5/2019 |

* cited by examiner

DISPLAY PANEL AND DISPLAY DEVICE

FIELD OF INVENTION

The present invention relates to a field of display technologies, and in particular, to a method of manufacturing display devices, and specifically related to display panels and display devices.

BACKGROUND OF INVENTION

At present, organic light-emitting diode (OLED) technology, having foldable characteristics, can achieve a narrow frame to pursue a higher screen ratio, while material of a folding area requires a strong resistance to breakage.

In current technologies, metal traces of the folding area are generally placed above a stress balance line of the folding area (when an object is deformed, all points in the object are tensile stress and compressive stress which are generated by resisting deformation, and a line connecting points where a resultant force of the tensile stress and the compressive stress is zero constitutes a stress balance line), which causes metal traces of the folding area to be easily broken, so that the signal cannot be transmitted, and reliability of OLED display panels to be reduced.

In summary, it is necessary to provide a display panel and a display device which can improve fracture resistance of metal traces in the folding area.

Technical Problem

The present invention provides a display panel and a display device, which has a stress balance line having an upper boundary and a lower boundary when a folding area is folded by patterning an organic layer and/or an inorganic layer in a film layer of the folding area. Moreover, a metal trace layer is disposed between the upper boundary and the lower boundary of the stress balance line, which solves the problem that metal traces of the folding area in the current art are easily broken.

SUMMARY OF INVENTION

Technical Solution

In order to solve the above problems, the technical solution provided by the present invention is as follows.

An embodiment of the present invention provides a display panel, the display panel including a folding area configured to bend the display panel, the display panel further including a film layer, wherein the film layer is disposed in the folding area, and the film layer includes a metal layer; wherein a stress balance line is provided in the film layer when the folding area is bent, wherein the stress balance line is a curve having an upper boundary and a lower boundary, a resultant force of a tensile stress and a compressive stress at any point on the stress balance line is zero; and wherein the metal layer is disposed between the upper boundary and the lower boundary of the stress balance line.

In one embodiment, the film layer further includes a substrate, the substrate is disposed on a side of the metal layer to support the metal layer, and the substrate includes a first organic layer.

In one embodiment, the substrate further includes an inorganic layer, the inorganic layer is disposed on a side of the first organic layer away from the metal layer; the inorganic layer includes a plurality of inorganic portions, heights of the plurality of inorganic portions are not same and bottom areas of the plurality of inorganic portions are not same; or, heights of the plurality of inorganic portions are not same or bottom areas of the plurality of inorganic portions are not same; wherein the first organic layer includes a plurality of first organic portions, the plurality of first organic portions are disposed above the plurality of inorganic portions, and the first organic portions are disposed opposite to the corresponding inorganic portions.

In one embodiment, the substrate further includes a second organic layer, the second organic layer is disposed on a side of the inorganic layer away from the first organic layer.

In one embodiment, the folding area includes a target line, and the target line passes through a midpoint of a line connecting any corresponding two endpoints of the folding area, and a volume average of each of the inorganic portions has an increasing relationship with a distance between each of the inorganic portions and the target line.

In one embodiment, an average height of each of the inorganic portions has an increasing relationship with a distance between each of the inorganic portions and the target line.

In one embodiment, an average value of a bottom area of each of the inorganic portions has an increasing relationship with a distance between each of the inorganic portions and the target line.

In one embodiment, the metal layer includes a plurality of metal lines, each of the metal lines includes at least one through hole and an organic substance filled in the through hole.

In one embodiment, the metal layer includes a plurality of metal lines, each of the metal lines includes at least one through hole and an organic substance filled in the through hole.

In one embodiment, the plurality of inorganic portions include a plurality of target inorganic portions, a height of each of the first organic portions corresponding to one of the target inorganic portions is greater than a height of the corresponding target inorganic portion, and each of the metal lines includes a plurality of through holes disposed opposite to the plurality of target inorganic portions respectively.

An embodiment of the present invention further provides a display device, the display device includes a display panel, the display panel including a folding area configured to bend the display panel, and the display panel further including a film layer, wherein the film layer is disposed in the folding area, and the film layer includes a metal layer; wherein a stress balance line is provided in the film layer when the folding area is bent, wherein the stress balance line is a curve having an upper boundary and a lower boundary, and a resultant force of a tensile stress and a compressive stress at any point on the stress balance line is zero; wherein the metal layer is disposed between the upper boundary and the lower boundary of the stress balance line.

In one embodiment, the film layer further includes a substrate, the substrate is disposed on a side of the metal layer to support the metal layer, and the substrate includes a first organic layer.

In one embodiment, the substrate further includes an inorganic layer, the inorganic layer is disposed on a side of the first organic layer away from the metal layer; the inorganic layer includes a plurality of inorganic portions, heights of the plurality of inorganic portions are not same and bottom areas of the plurality of inorganic portions are not same; or, heights of the plurality of inorganic portions are not same or bottom areas of the plurality of inorganic portions are not same; wherein the first organic layer includes a plurality of first organic portions, the plurality of first organic portions are disposed above the plurality of inorganic portions, and the first organic portions are disposed opposite to the corresponding inorganic portions.

In one embodiment, the substrate further includes a second organic layer, the second organic layer is disposed on a side of the inorganic layer away from the first organic layer.

In one embodiment, the folding area includes a target line, and the target line passes through a midpoint of a line connecting any corresponding two endpoints of the folding area, and a volume average of each of the inorganic portions has an increasing relationship with a distance between each of the inorganic portions and the target line.

In one embodiment, an average height of each of the inorganic portions has an increasing relationship with a distance between each of the inorganic portions and the target line.

In one embodiment, an average value of a bottom area of each of the inorganic portions has an increasing relationship with a distance between each of the inorganic portions and the target line.

In one embodiment, the metal layer includes a plurality of metal lines, each of the metal lines includes at least one through hole and an organic substance filled in the through hole.

In one embodiment, the metal layer includes a plurality of metal lines, each of the metal lines includes at least one through hole and an organic substance filled in the through hole.

In one embodiment, the plurality of inorganic portions include a plurality of target inorganic portions, a height of each of the first organic portions corresponding to one of the target inorganic portions is greater than a height of the corresponding target inorganic portion, and each of the metal lines includes a plurality of through holes disposed opposite to the plurality of target inorganic portions respectively.

Beneficial Effect

The present invention provides a display panel and a display device, each of the display panel and the display device includes a folding area and a film layer disposed in the folding area. The film layer includes a metal layer. Through an organic layer and/or an inorganic layer in the film layer is patterned to form a stress balance line having an upper boundary and a lower boundary when the folding area is bent, and a metal layer is disposed between the upper boundary and the lower boundary of the stress balance line, thereby improving fracture resistance of the metal layer of the folding area.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art can obtain the other drawings without any creative effort.

DETAILED DESCRIPTION OF EMBODIMENTS

The following content combines with the drawings and the embodiment for describing the present invention in detail. It is obvious that the following embodiments are only some embodiments of the present invention. For the skilled persons of ordinary skill in the art without creative effort, the other embodiments obtained thereby are still covered by the present invention.

In the description of the present invention, it is to be understood that the orientation or positional relationship of the terms "upper", "lower", "surface", "vertical", and the like is based on the orientation or positional relationship shown in the drawings, wherein "on" is only above an object, specifically refers to top, slope, upper surface, as long as it is above the level of the object, and the "surface" refers to the direct contact between the two objects. The aforementioned orientation or position relationship is intended only to facilitate the description of the present invention and a simplified description, and not to indicate or imply that the device or component referred to must have a specific orientation, construct and operate in a particular orientation, and therefore cannot be understood as a limitation of the present invention.

In addition, the structures in the default drawings of the present invention are all placed in the horizontal direction, so that a length or a width of the structure defaults to size in the horizontal direction, and a height of the structure defaults to size in the vertical direction.

In addition, it should be noted that the drawings provide only the structures and steps that are closely related to the present invention, and omits some details that are not related to the invention, and the purpose is to simplify the drawings and make the invention clear, rather than indicating actual devices and methods are exactly the same as the drawings and are not intended to limit actual devices and methods.

Figure 1:
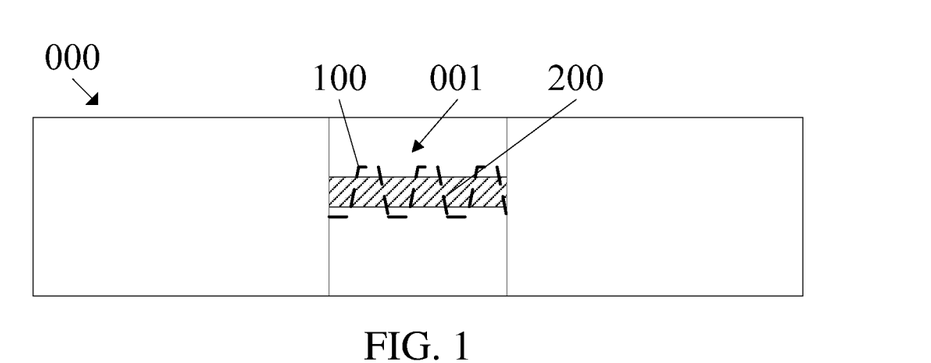
FIG. 1 is a schematic cross-sectional view showing a display panel according to an embodiment of the present invention.

The present invention provides a display device as shown in each of FIGS. 1 to 16. As shown in FIG. 1, a display panel 000 provided by the present invention includes a folding area 001 for bending the display panel 000, the display panel further including a film layer. The film layer is disposed in the folding area and further includes a metal layer 200. A stress balance line 100 is provided in the film layer when the folding area 001 is bent. The stress balance line 100 is a curve having an upper boundary and a lower boundary, a resultant force of tensile stress and compressive stress at any point on the stress balance line 100 is zero. The metal layer 200 is disposed between the upper boundary and the lower boundary of the stress balance line 100.

The stress balance line 100 can be such that the metal layer 200 is disposed between the upper boundary and the lower boundary of the stress balance line 100. The upper boundary is defined herein as a horizontal line passing through the highest point of the stress balance line 100, and the lower boundary is defined as a horizontal line passing through the lowest point of the stress balance line 100, and ranges of the upper boundary and the lower boundary are not limited.

Figure 2:
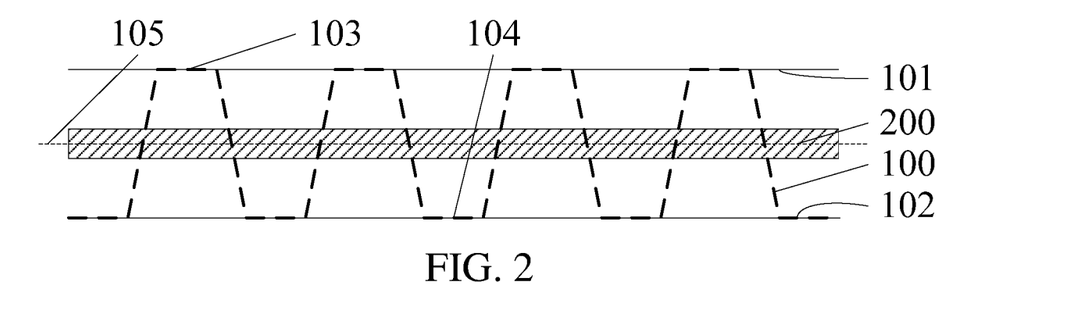
FIG. 2 is a schematic diagram showing the positional relationship between a stress balance line and a metal layer in a folding area according to an embodiment of the present invention.

In an embodiment, as shown in FIG. 2, a distance between a peak 103 of the stress balance line 100 and a centerline 105 of the stress balance line 100 and a distance between a valley 104 of the stress balance line 100 and the centerline 105 of the stress balance line 100 can be equal, wherein the centerline 105 is parallel to the upper boundary 101 and the lower boundary 102 of the stress balance line 100, and a distance between the highest peak 103 of the stress balance line 100 and the centerline 105 is equal to a distance between the lowest valley 104 of the stress balance line 100 and the centerline 105.

Figure 3:
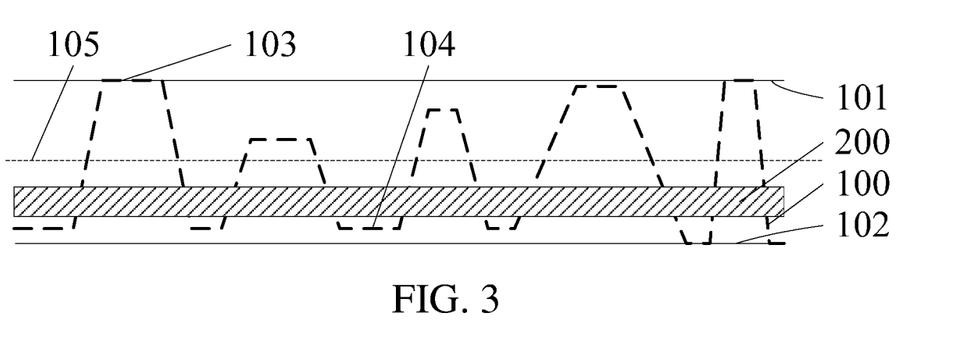
FIG. 3 is a schematic diagram showing another positional relationship between a stress balance line and a metal layer in a folding area according to an embodiment of the present invention.

In an embodiment, as shown in FIG. 3, the distance between the peak 103 of the stress balance line 100 and the centerline 105 of the stress balance line 100, and the distance between the valley 104 of the stress balance line 100 and the centerlines 105 of the stress balance line 100 cannot be equal. Further, heights of a plurality of the peaks 103 of the stress balance line 100 can be not same, and heights of a plurality of the valleys 104 of the stress balance line 100 can also be not same.

It can be understood that, as compared with the conventional case where only the stress balance line 100 is directly moved up near to the metal layer 200, the stress balance line 100 of the display panel 000 in the present embodiment is a curve having an upper boundary 101 and a lower boundary 102, and the metal layer 200 is positioned between the upper boundary 101 and the lower boundary 102 of the stress balance line 100, so that the metal layer 200 can always be within the range covered by the stress balance line 100 in the vertical direction. Furthermore, when the distance between the metal layer 200 and the centerline 105 in the embodiment is equal to the distance between the metal layer 200 and the stress balance line 100 in the latter design, the folding area 001 is bent and the metal layer 200 in this embodiment is less likely to be broken. Therefore, when the metal layer 200 of each of both ends up to achieve the same fracture resistance, a distance between the metal layer 200 and the centerline 105 can be allowed in this embodiment is greater than a distance between the metal layer 200 and the stress balance line 100 in the latter design. That is, the distance difference between the stress balance line 100 and the metal layer 200 can be appropriately allowed to be slightly larger, therefore the present embodiment can increase process tolerance of a bending process to reduce accuracy requirements of the equipment.

It can be understood that, since the folding area 001 refers to the area for bending in the display panel 000, a height of the folding area 001 is equal to a height of the display panel 000, and is a three-dimensional area, but it is not limited to the specific position of the folding area 001 at the display panel 000.

Figure 4:
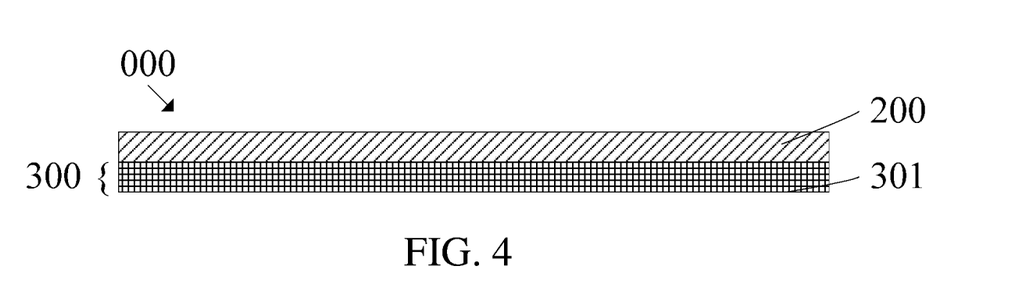
FIG. 4 is a schematic cross-sectional view showing a film layer of a folding area according to an embodiment of the present invention.

In an embodiment, as shown in FIG. 4, the film layer of the folding area 001 further includes a substrate 300 disposed on a side of the metal layer 200 to support the metal layer 200. The substrate 300 includes a first organic layer 301.

The specific shape of the first organic layer 301 is not limited and is not limited to the substrate 300 including only the first organic layer 301.

Figure 5:
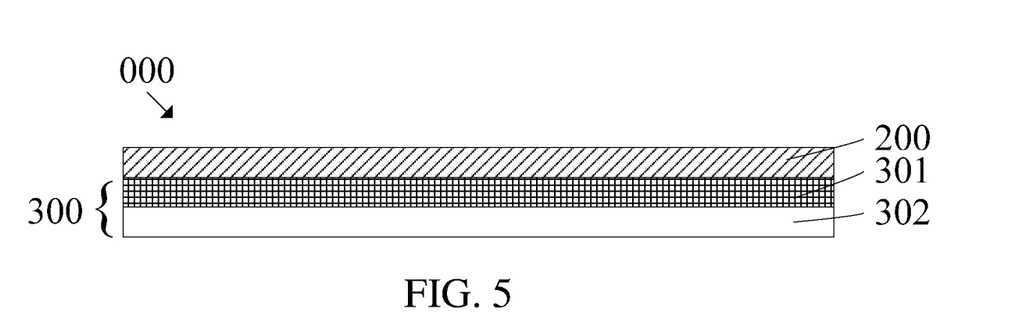
FIG. 5 is a schematic cross-sectional view showing a film layer of another folding area according to an embodiment of the present invention.

In an embodiment, as shown in FIG. 5, the substrate 300 further includes an inorganic layer 302 disposed on a side of the first organic layer 301 away from the metal layer 200.

Figure 6:
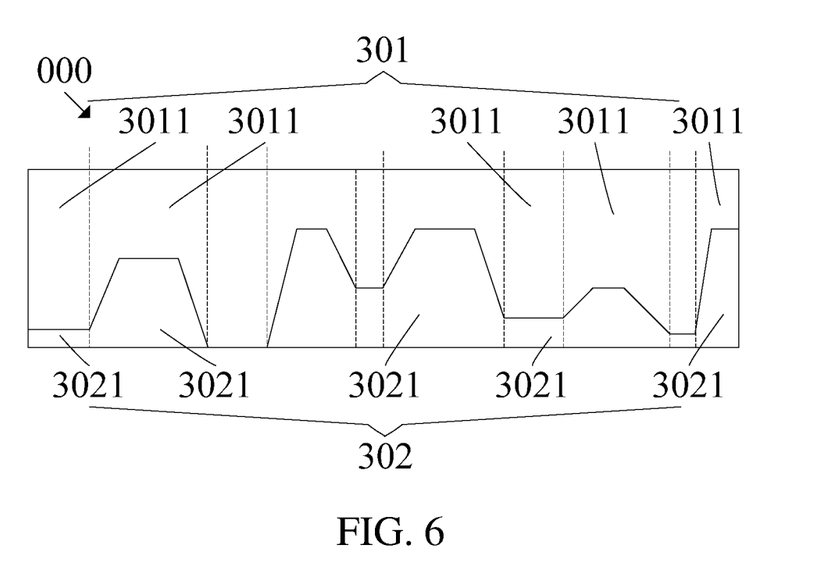
FIG. 6 is a schematic cross-sectional view showing a first organic layer and an inorganic layer of a first folding area according to an embodiment of the present invention.

Specifically, as shown in FIG. 6, the inorganic layer 302 includes a plurality of inorganic portions 3021, the heights of the plurality of inorganic portions 3021 are not same, and/or the bottom areas of the plurality of inorganic portions 3021 are not same. The first organic layer 301 includes a plurality of first organic portions 3011 disposed above the plurality of inorganic portions 3021, and the first organic portions 3011 are disposed opposite to the corresponding inorganic portions 3021.

For each of the inorganic portions 3021, a bottom surface of the inorganic portion 3021 can be a circular, rectangular or other planar pattern having a fixed area. A top surface of the inorganic portion 3021 can also be a circular, rectangular or other planar pattern having a fixed area. The shape of the top surface and the bottom surface can be different.

It can be understood that the shape and size of a side surface of the inorganic portion 3021 are affected by the shape and size of the top surface and the bottom surface, and the side surface is also a closed pattern. It should be noted that a height of the inorganic portion 3021 can be defined as a vertical distance between the top surface and the bottom surface.

The plurality of inorganic portions 3021 can be continuously arranged, all of them spaced apart by a distance or partially continuously arranged.

It is to be understood that, after the inorganic layer 302 is patterned to form the plurality of inorganic portions 3021, a process such as coating is performed in a gap between the plurality of inorganic portions 3021 and on a surface of the plurality of inorganic portions 3021. The process is such as to form the first organic layer 301. It is understood that a thickness of a coated material determines a height of the first organic layer 301. An upper surface of the first organic layer 301 can be a plane parallel to the horizontal direction, for example, a vertical height of the upper surface of the first organic layer 301 can be equal to or greater than a height of a top surface of the highest inorganic portion 3021 to ensure that the first organic layer 301 can completely cover the inorganic layer 302. A division manner of the plurality of first organic portions 3011 in the first organic layer 301 can be in one-to-one correspondence with the inorganic portion 3021 in the horizontal direction, and reference can be made to a division manner of the dotted line in FIG. 6.

Figure 7:
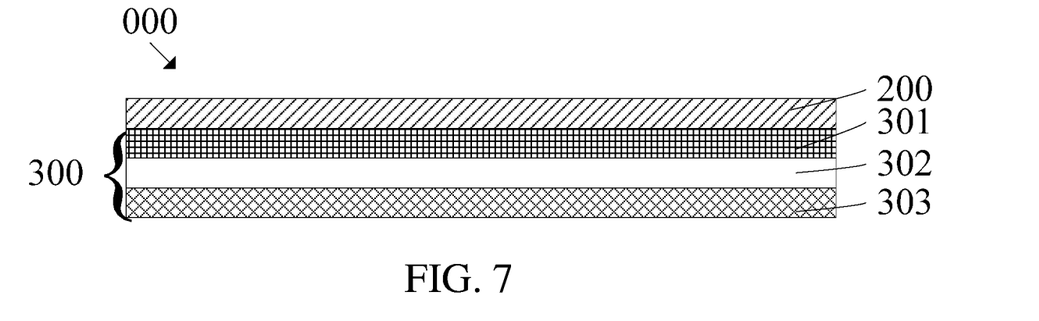
FIG. 7 is a schematic cross-sectional structural view showing a film layer of another folding area according to an embodiment of the present invention.

In an embodiment, as shown in FIG. 7, the substrate 300 further includes a second organic layer 303 disposed on a side of the inorganic layer 302 away from the first organic layer 301.

The specific shape of the second organic layer 303 is not limited. For example, the second organic layer 303 can be a whole organic layer directly coated with an organic substance without being patterned. The second organic layer 303 can also include a plurality of second organic portions, wherein each of the second organic portions can be disposed opposite to each of the corresponding inorganic portions 3021.

Figure 8:
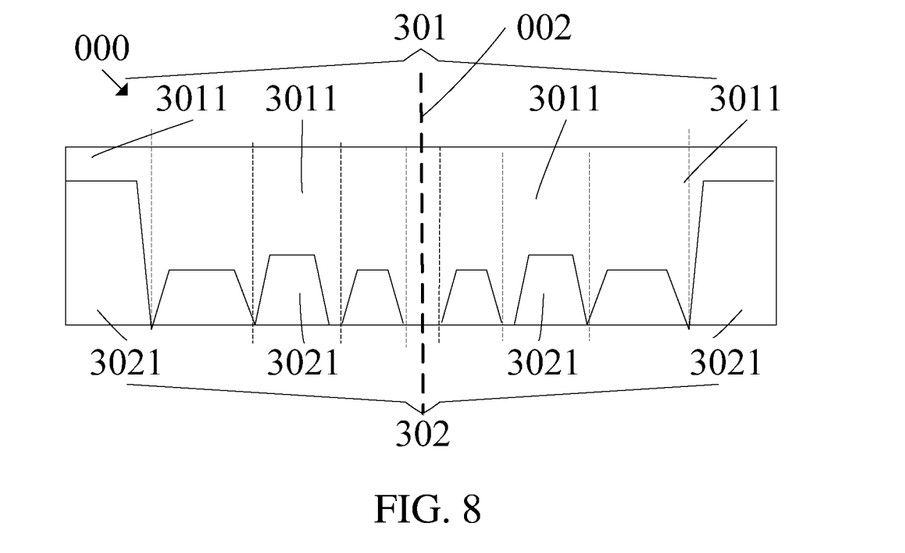
FIG. 8 is a schematic cross-sectional view showing a first organic layer and an inorganic layer of a second folding area according to an embodiment of the present invention.

In an embodiment, as shown in FIG. 8, the folding area 001 includes a target line 002, and the target line 002 passes through a midpoint of a line connecting any corresponding two endpoints of the folding area. A volume average of each of the inorganic portions 3021 has an increasing relationship with a distance between each of the inorganic portions 3021 and the target line 002.

The target line 002 can be defined as a line passing through a midpoint of a line connecting any corresponding two endpoints of the folding area 001 in a top view of the folding area 001, and can also be defined as a line passing through a midpoint of a line connecting any corresponding two endpoints of the folding area 001 in a sectional view of the folding area 001, taking a sectional view in FIG. 8 as an example. It can be understood that no matter what definition, the relationship between the volume average of any of the inorganic portions 3021 and the target line 002 should satisfy the above relationship.

The increasing relationship can be a linear increase or a non-linear increase.

Here, the manner of disposing the inorganic portions that satisfy the increasing relationship between the volume average of each of the inorganic portions 3021 and the distance between each of the inorganic portions 3021 and the target line 002 can include the following embodiments.

Figure 9:
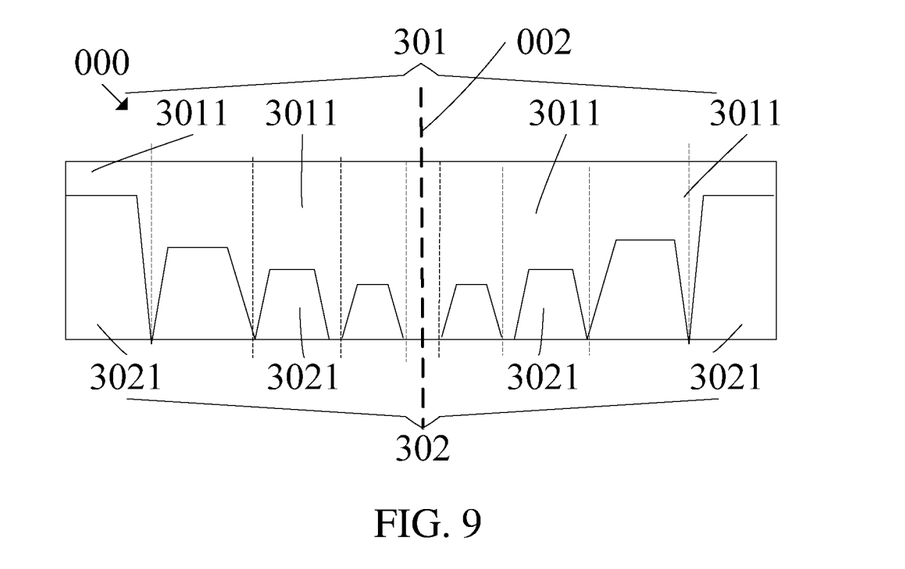
FIG. 9 is a schematic cross-sectional view showing a first organic layer and an inorganic layer of a third folding area according to an embodiment of the present invention.
Figure 10:
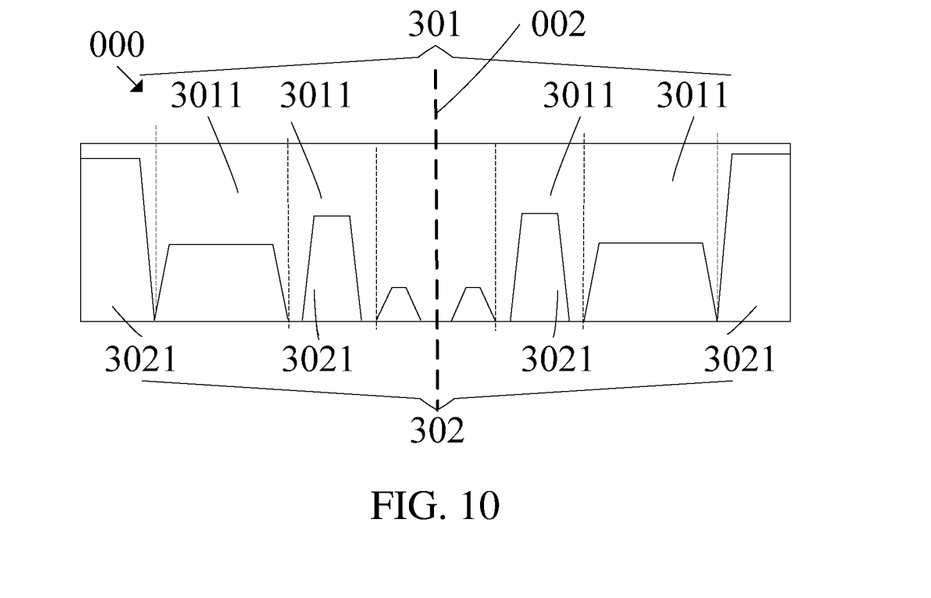
FIG. 10 is a schematic cross-sectional view showing a first organic layer and an inorganic layer of a fourth folding area according to an embodiment of the present invention.

In an embodiment, as shown in FIGS. 8, 9, and 10, a distribution pattern of the inorganic portions 3021, and shape and size of the inorganic portions 3021 in the inorganic layer 302 can be symmetric with respect to the target line 002. It can be understood that the inorganic portions 3021 also cannot be symmetrical about the target line 002.

Figure 11:
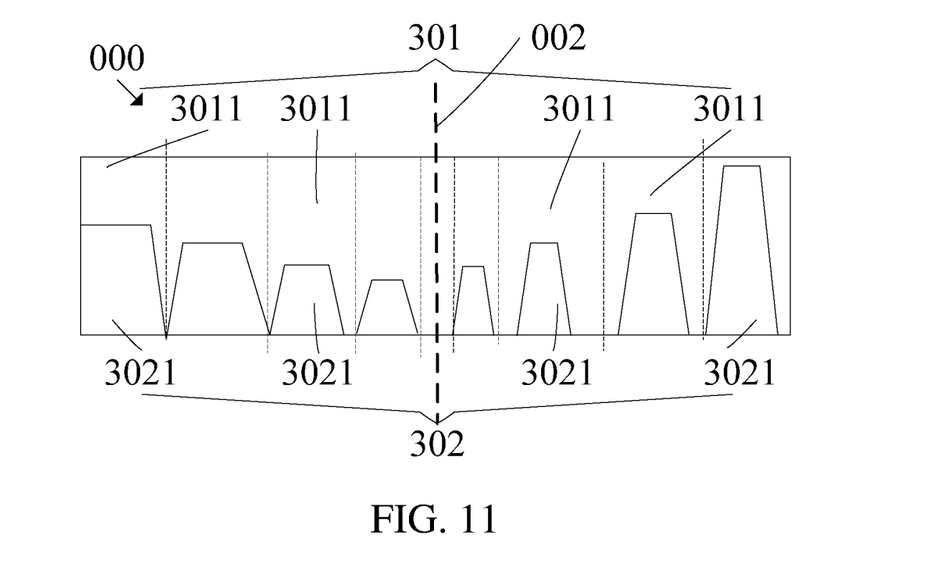
FIG. 11 is a schematic cross-sectional view showing a first organic layer and an inorganic layer in a fifth folding area according to an embodiment of the present invention.

In one embodiment, as shown in FIGS. 9 and 11, an average height of each of the inorganic portions 3021 of the inorganic layer 302 has an increasing relationship with a distance between each of the inorganic portions 3021 and the target line 002. In particular, as shown in FIG. 11, in the case where the inorganic portions 3021 are not symmetrical with respect to the target line 002, the inorganic portions 3021 on both sides of the target line 002 can be respectively arranged according to "an average height of each of the inorganic portions 3021 of the inorganic layer 302 has an increasing relationship with a distance between each of the inorganic portions 3021 and the target line 002", wherein a relationship of an average height of the inorganic portions 3021 between both sides of the target line 002 is no limit.

Figure 12:
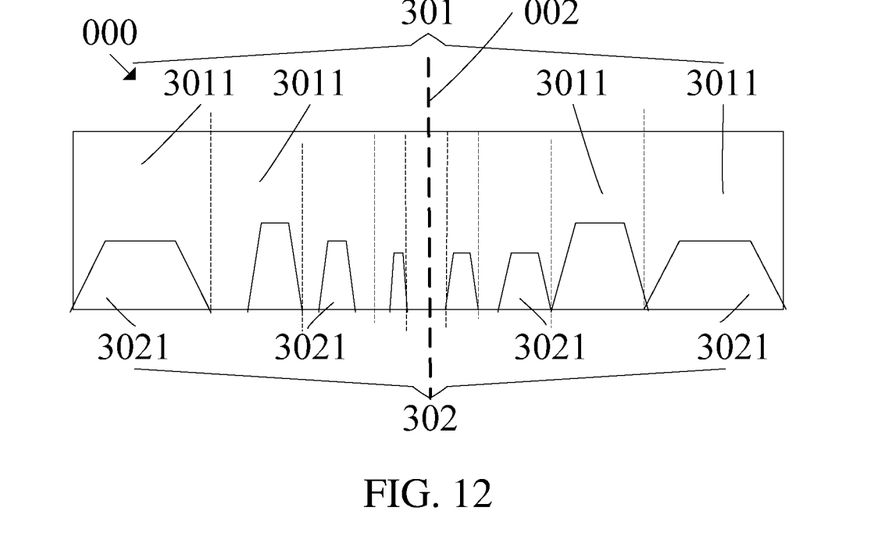
FIG. 12 is a schematic cross-sectional view showing a first organic layer and an inorganic layer in a sixth folding area according to an embodiment of the present invention.

In an embodiment, as shown in FIGS. 10 and 12, an average value of a bottom area of each of the inorganic portions 3021 has an increasing relationship with a distance between each of the inorganic portions 3021 and the target line 002. In particular, as shown in FIG. 12, in a case where the inorganic portions 3021 are not symmetrical with respect to the target line 002, the inorganic portions 3021 on both sides of the target line 002 can be respectively arranged according to "an average value of a bottom area of each of the inorganic portions 3021 has an increasing relationship with a distance between each of the inorganic portions 3021 and the target line 002", wherein the average value of the bottom areas of the inorganic portions 3021 on both sides of the target line 002 can be equal or not same.

It should be noted that since FIGS. 8-12 are the cross-sectional view, a bottom area of the inorganic portion 3021 cannot be characterized. Here, a lower surface of the inorganic portion 3021 can be equal in size except for the width, so that the width of the inorganic portion 3021 is used to characterize the bottom area of the inorganic portion 3021.

Figure 13:
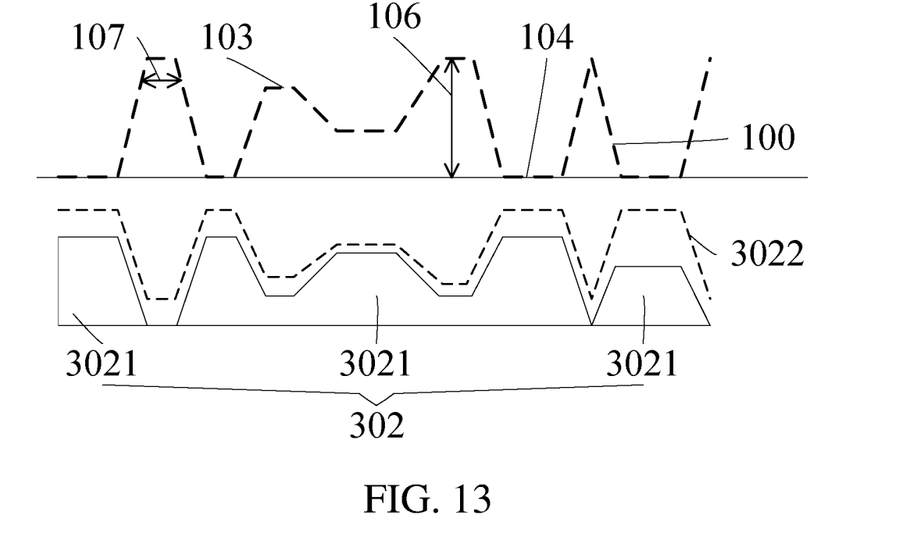
FIG. 13 is a schematic diagram showing the relationship between a stress balance line of a folding area and an inorganic layer according to an embodiment of the present invention.

It can be understood that, as shown in FIG. 13, a distribution of the stress balance line 100 is related to size, dimension, and distribution of the inorganic portions 3021 in the inorganic layer 302. For example, the larger/smaller a height value of the inorganic portion 3021, the smaller/larger a height value corresponding to the stress balance line 100. The larger a width value at the cross-section of the inorganic portion 3021, the larger a width value of the valley corresponding to the stress balance line 100. The larger a gap value at the cross-section of the adjacent two inorganic portions 3021, the larger a width value of the peak corresponding to the stress balance line 100. It can be thought that a contour line 3022 formed by upper surfaces and slanting surfaces of the plurality of inorganic portions 3021 is a curve formed in the horizontal direction being folded and then being stretched M times in the vertical direction or being compressed P/Q times, that is, the curve can coincide with the stress balance line 100, wherein M, P, and Q are positive integers.

Therefore, by setting arrangement of the plurality of inorganic portions 3021 according to "a volume average of each of the inorganic portions 3021 has an increasing relationship with a distance between each of the inorganic portions 3021 and the target line 002" which realizes the stress balance line 100 close to an intermediate area of the folding area 001. The larger a height of the peak of the stress balance line 100 or the larger a width of the peak of the stress balance line 100 along a predetermined horizontal line, so that the stress balance line in a region close to an intermediate area of the folding area 001 as a whole is closer to the metal layer 200. Since the metal layer 200 close to the region in the middle of the folding area 001 is more likely to be broken, the present embodiment can improve the fracture resistance of the metal layer 200 of the folding area 001.

Figure 14:
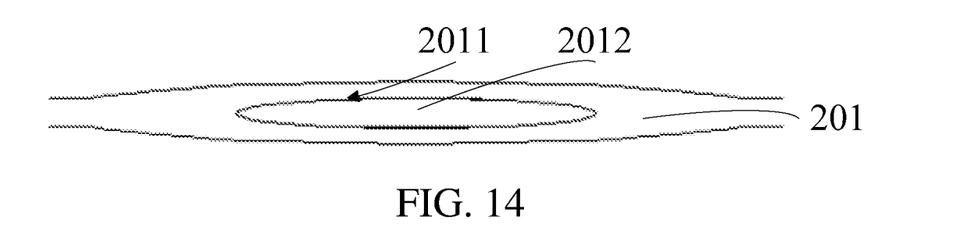
FIG. 14 is a schematic top plan view showing a metal layer of a folding area according to an embodiment of the present invention.
Figure 15:
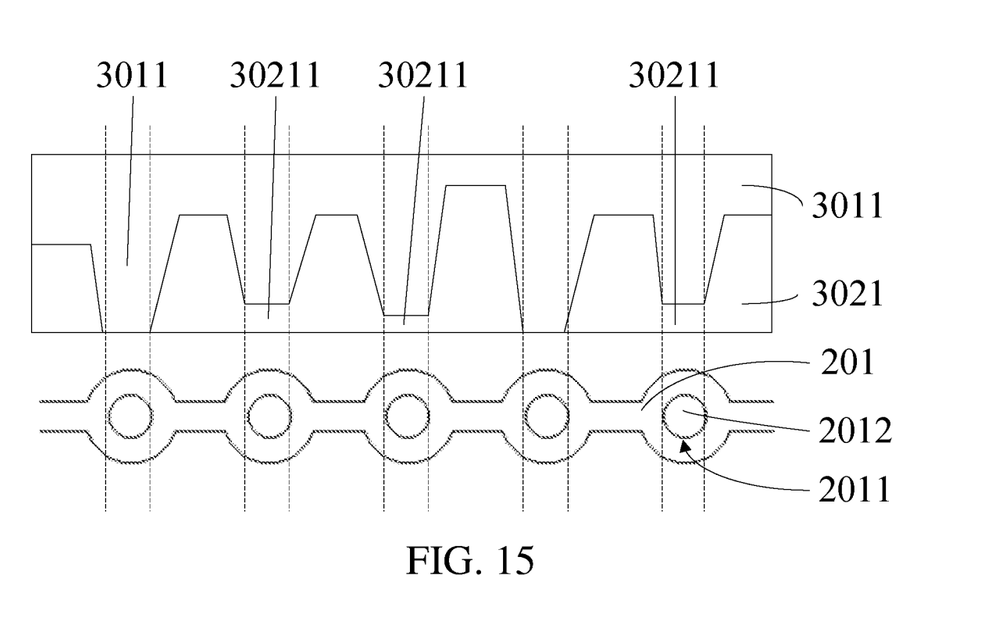
FIG. 15 is a schematic top plan view showing a metal layer of another folding area according to an embodiment of the present invention.

In an embodiment, as shown in FIGS. 14-15, the metal layer 200 includes a plurality of metal lines 201, each of the metal lines includes at least one through hole 2011 and an organic substance 2012 filled in the through holes 2011.

It should be noted that, except for the organic substance 2012 in the through hole 2011, the other materials can be metal conductive materials. It can be understood that, in order to ensure that the metal lines 201 can realize the conductive function, the boundary of the through hole 2011 should be within the boundary of the metal line 201. The through hole 2011 can include but is not limited to, the following embodiments.

In an embodiment, as shown in FIG. 14, the metal line 201 includes a through hole 2011 and an organic substance 2012 filled in the through hole 2011. Further, the boundary of both ends of the through hole 2011 can coincide with the boundary of both ends of the folding area 001, or the boundary of both ends of the through hole 2011 can be within the boundary of both ends of the folding area 001.

In an embodiment, as shown in FIG. 15, the plurality of inorganic portions 3021 include a plurality of target inorganic portions 30211, a height of each of the first organic portions 3011 corresponding to one of the target inorganic portions 30211 is greater than a height of the corresponding target inorganic portion 30211, and each of the metal lines 201 includes a plurality of through holes disposed opposite to the plurality of target inorganic portions 30211 respectively.

It can be understood that when the height of the inorganic portion 3021 is zero, the height of the inorganic portion 3021 is also smaller than the height of the corresponding first organic portion 3011, therefore, the region of the metal line 201 corresponding to the inorganic portion 3021 having a height of zero can also be provided with the through hole 2011.

Alternatively, each of the plurality of through holes 2011 can be disposed opposite to the corresponding non-target inorganic portion, wherein the non-target inorganic portion is the inorganic portion 3021 other than the plurality of target inorganic portions 30211 among the plurality of inorganic portions 3021.

Alternatively, the adjacent two through holes 2011 can also be disposed at a predetermined distance, and the predetermined distance can be set according to the later actual bending condition of the folding area 001 and the distribution of the stress balance line 100. The predetermined distance between the two adjacent through holes 2011 is not limited to be equal.

It can be understood that, in this embodiment, since the metal line 201 is provided with the through hole 2011, when the metal line 201 is bent by force, if somewhere is broken, the organic substance 2012 inside the through hole 2011 can prevent the crack at the fracture from extending to both sides or one side thereof, and the risk of the metal line 201 breaking can be reduced.

Figure 16:
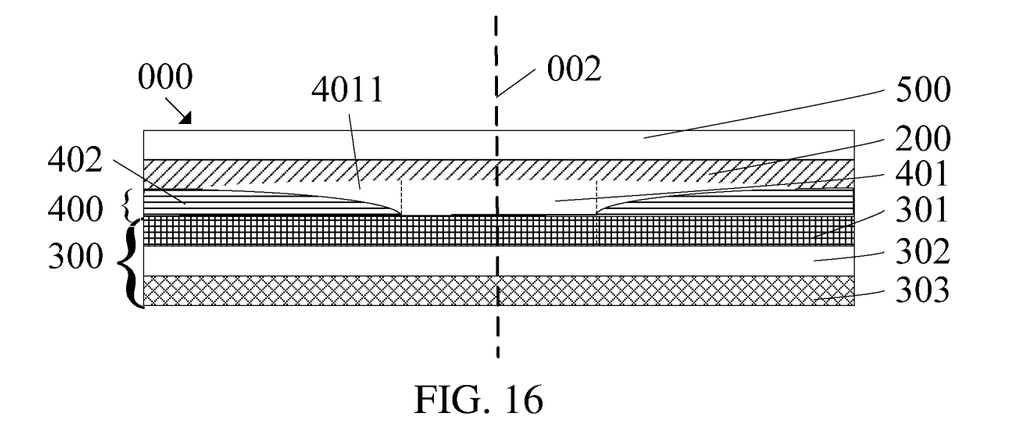
FIG. 16 is a schematic cross-sectional structural view showing a film layer of another folding area according to an embodiment of the present invention.

In an embodiment, as shown in FIG. 16, the display panel 000 further includes a buffer layer 400 disposed between the substrate 300 and the metal layer 200, and a planarization layer 500 disposed on a side of the metal layer 200 away from the substrate 300, wherein the buffer layer 400 includes a first buffer portion 401 and a second buffer portion 402 disposed on both sides of the first buffer portion 401.

The constituent materials of the first buffer portion 401 and the second buffer portion 402 can each be an organic substance. It should be noted that since the first buffer portion 401 is disposed more close to an intermediate portion of the folding area 000 compared with the second buffer portion 402, when a force is formed into a bend, a resultant force of the stress is large, so the elastic modulus of the constituent material of the first buffer portion 401 can be less than the elastic modulus of the constituent material of the second buffer portion 402, so that bending resistance of the first buffer portion 401 is greater than bending resistance of the second buffer portion 402.

Further, as shown in FIG. 16, a height of a sub-buffer portion 4011 disposed near the two ends of the first buffer portion 401 can be set to be in a decreasing relationship with a distance from the sub-buffer portion 4011 to the target line 002. Therefore, the first buffer portion 401 is gradually transitioned to the second buffer portion 402. Further, the sub-buffer portion 4011 can be disposed on the second buffer portion 402. When the folding area 000 is bent, deformation in the peripheral first buffer portion 401 is large, and also the elastic modulus of the first buffer portion 401 is related small, so that the second buffer portion 402 having a greater elastic modulus can be appropriately protected.

The constituent materials of the first organic layer 301, the second organic layer 303, the buffer layer 400, and the planarization layer 500 can all be organic substances, and further, according to physical properties required by different film layers and different regions, fabrication parameters are adjusted to obtain different film layers having different physical properties in the final.

Beneficial effect of the present invention is as follows. The present invention provides a display panel and a display device, each of the display panel and the display device includes a folding area and a film layer disposed in the folding area. The film layer includes a metal layer. Through an organic layer and/or an inorganic layer in the film layer is patterned to form a stress balance line having an upper boundary and a lower boundary when the folding area is bent, and a metal layer is disposed between the upper boundary and the lower boundary of the stress balance line, thereby improving fracture resistance of the metal layer of the folding area.

The structures of a display panel and a display device including the display panel provided by the embodiments of the present invention are described in detail above. The principles and implementation of the present invention are described in the embodiments. The description is only for helping to understand the technical solution of the present invention and its core idea. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display panel, comprising a folding area configured to bend the display panel, the display panel further comprising a film layer, wherein the film layer is disposed in the folding area, and the film layer comprises a metal layer;
    wherein a stress balance line is provided in the film layer when the folding area is bent, wherein the stress balance line is a curve having an upper boundary and a lower boundary, and a resultant force of tensile stress and compressive stress at any point on the stress balance line is zero;
    wherein the metal layer is disposed between the upper boundary and the lower boundary of the stress balance line.

2. The display panel of claim 1, wherein the film layer further comprises a substrate, the substrate is disposed on a side of the metal layer to support the metal layer, and the substrate comprises a first organic layer.

3. The display panel of claim 2, wherein the substrate further comprises an inorganic layer, the inorganic layer is disposed on a side of the first organic layer away from the metal layer;
    the inorganic layer comprises a plurality of inorganic portions, heights of the plurality of inorganic portions are not same and bottom areas of the plurality of inorganic portions are not same; or, heights of the plurality of inorganic portions are not same or bottom areas of the plurality of inorganic portions are not same;

wherein the first organic layer comprises a plurality of first organic portions, the plurality of first organic portions are disposed above the plurality of inorganic portions, and the first organic portions are disposed opposite to the corresponding inorganic portions.

4. The display panel of claim 3, wherein the substrate further comprises a second organic layer, the second organic layer is disposed on a side of the inorganic layer away from the first organic layer.

5. The display panel of claim 3, wherein the folding area comprises a target line, and the target line passes through a midpoint of a line connecting any corresponding two endpoints of the folding area, and a volume average of each of the inorganic portions has an increasing relationship with a distance between each of the inorganic portions and the target line.

6. The display panel of claim 5, wherein an average height of each of the inorganic portions has an increasing relationship with a distance between each of the inorganic portions and the target line.

7. The display panel of claim 5, wherein an average value of a bottom area of each of the inorganic portions has an increasing relationship with a distance between each of the inorganic portions and the target line.

8. The display panel of claim 3, wherein the metal layer comprises a plurality of metal lines, each of the metal lines comprises at least one through hole and an organic substance filled in the through hole.

9. The display panel of claim 8, wherein the plurality of inorganic portions comprise a plurality of target inorganic portions, a height of each of the first organic portions corresponding to one of the target inorganic portions is greater than a height of the corresponding target inorganic portion, and each of the metal lines comprises a plurality of through holes disposed opposite to the plurality of target inorganic portions respectively.

10. The display panel of claim 1, wherein the metal layer comprises a plurality of metal lines, each of the metal lines comprises at least one through hole and an organic substance filled in the through hole.

11. A display device, which the display device comprises a display panel, the display panel comprising a folding area configured to bend the display panel, and the display panel further comprising a film layer, wherein the film layer is disposed in the folding area, and the film layer comprises a metal layer;

wherein a stress balance line is provided in the film layer when the folding area is bent, wherein the stress balance line is a curve having an upper boundary and a lower boundary, a resultant force of a tensile stress and a compressive stress at any point on the stress balance line is zero; and wherein the metal layer is disposed between the upper boundary and the lower boundary of the stress balance line.

12. The display device of claim 11, wherein the film layer further comprises a substrate, the substrate is disposed on a side of the metal layer to support the metal layer, and the substrate comprises a first organic layer.

13. The display device of claim 12, wherein the substrate further comprises an inorganic layer, the inorganic layer is disposed on a side of the first organic layer away from the metal layer;

the inorganic layer comprises a plurality of inorganic portions, heights of the plurality of inorganic portions are not same and bottom areas of the plurality of inorganic portions are not same; or, heights of the plurality of inorganic portions are not same or bottom areas of the plurality of inorganic portions are not same;

wherein the first organic layer comprises a plurality of first organic portions, the plurality of first organic portions are disposed above the plurality of inorganic portions, and the first organic portions are disposed opposite to the corresponding inorganic portions.

14. The display device of claim 13, wherein the substrate further comprises a second organic layer, the second organic layer is disposed on a side of the inorganic layer away from the first organic layer.

15. The display device of claim 13, wherein the folding area comprises a target line, and the target line passes through a midpoint of a line connecting any corresponding two endpoints of the folding area, and a volume average of each of the inorganic portions has an increasing relationship with a distance between each of the inorganic portions and the target line.

16. The display device of claim 15, wherein an average height of each of the inorganic portions has an increasing relationship with a distance between each of the inorganic portions and the target line.

17. The display device of claim 15, wherein an average value of a bottom area of each of the inorganic portions has an increasing relationship with a distance between each of the inorganic portions and the target line.

18. The display device of claim 13, wherein the metal layer comprises a plurality of metal lines, each of the metal lines comprises at least one through hole and an organic substance filled in the through hole.

19. The display device of claim 18, wherein the plurality of inorganic portions comprise a plurality of target inorganic portions, a height of each of the first organic portions corresponding to one of the target inorganic portion is greater than a height of the corresponding target inorganic portion, and each of the metal lines comprises a plurality of through holes disposed opposite to the plurality of target inorganic portions respectively.

20. The display device of claim 11, wherein the metal layer comprises a plurality of metal lines, each of the metal lines comprises at least one through hole and an organic substance filled in the through hole.

* * * * *